US012623861B2

(12) United States Patent
Wada

(10) Patent No.: US 12,623,861 B2
(45) Date of Patent: May 12, 2026

(54) TRANSPORT VEHICLE WITH GRIP DRIVE SECTION

(71) Applicant: Daifuku Co., Ltd., Osaka (JP)

(72) Inventor: Yoshinari Wada, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 187 days.

(21) Appl. No.: 18/532,406

(22) Filed: Dec. 7, 2023

(65) Prior Publication Data

US 2024/0190666 A1      Jun. 13, 2024

(30) Foreign Application Priority Data

Dec. 8, 2022      (JP) .................................. 2022-196564

(51) Int. Cl.
*H01L 21/677* (2006.01)
*B65G 47/90* (2006.01)
*H10P 72/30* (2026.01)

(52) U.S. Cl.
CPC .......... *B65G 47/90* (2013.01); *H10P 72/3221* (2026.01)

(58) Field of Classification Search
CPC ....................... H01L 21/67733; H10P 72/3221
See application file for complete search history.

(56) References Cited

U.S. PATENT DOCUMENTS 8,939,696 B2 * 1/2015 Lee .................... H01L 21/67733
414/222.01
9,558,977 B2 * 1/2017 Usami ............... H01L 21/67712

10,770,326 B2 * 9/2020 Ehrne ................. H01L 21/6773
10,964,573 B2 * 3/2021 Kobayashi ........ H01L 21/67259
12,106,990 B2 * 10/2024 Kobayashi ............. B25J 15/009
2004/0191042 A1 * 9/2004 Chen ................. H01L 21/67763
414/618
2008/0011742 A1 * 1/2008 Bellehumeur .......... B66C 1/663
220/1.5
2010/0143084 A1 * 6/2010 Murata ............. H01L 21/68707
414/225.01
2013/0220959 A1 * 8/2013 Won .................... H01L 21/6773
254/266
2024/0067448 A1 * 2/2024 Kinugawa ......... H01L 21/68707
2024/0190666 A1 * 6/2024 Wada ..................... B65G 47/90

FOREIGN PATENT DOCUMENTS

JP          H11320471 A   * 11/1999
JP          200564130 A     3/2005
JP          2016163001 A   * 9/2016
WO       WO-2021181924 A1 * 9/2021   ............. H01L 21/68

* cited by examiner

*Primary Examiner* — Gerald McClain
(74) *Attorney, Agent, or Firm* — The Webb Law Firm

(57) ABSTRACT

A first guide body includes a pair of first guide surfaces and corrects the position in a second direction of a gripping body section relative to a first grip section by at least one of the pair of first guide surfaces coming into contact with the first grip section during a lowering operation for gripping. A second guide body includes a pair of second guide surfaces and corrects the position in the second direction of the gripping body section relative to a target grip section by at least one of the pair of second guide surfaces coming into contact with the target grip section during the lowering operation for gripping. The first guide body and the second guide body are spaced apart from each other in at least either a first direction or the second direction.

6 Claims, 8 Drawing Sheets

TRANSPORT VEHICLE WITH GRIP DRIVE SECTION

CROSS-REFERENCE TO RELATED APPLICATION

This application claims priority to Japanese Patent Application No. 2022-196564 filed Dec. 8, 2023, the disclosure of which is hereby incorporated by reference in its entirety.

BACKGROUND OF THE INVENTION

1. Field of the Invention

The present invention relates to a transport vehicle that travels along a travel route and transports a container having a predetermined shape.

2. Description of Related Art

For example, in a semiconductor manufacturing factory or the like, a semiconductor wafer or a glass substrate is housed in a dedicated container and transported in that state by a transport vehicle. The shape of the container is determined in advance in accordance with a standard. The transport vehicle is configured to grip the container using a gripping method that conforms to the shape of the container. One example of such a transport vehicle is disclosed in JP 2005-064130A (Patent Document 1). In the following description of the related art, the reference numbers shown in parentheses are those used in Patent Document 1.

The transport vehicle (1) disclosed in Patent Document 1 transfers a container (51) by using a gripping device (32) to grip a grip section (53) of the container (51). The gripping device (32) approaches the container (51) at a target transfer location from above, and stops at an appropriate position for gripping. At the stop position, the gripping device (32) starts a gripping operation and grips the grip section (53) of the container (51).

In the technique disclosed in Patent Document 1, the container (51) that is to be gripped includes one grip section (53). However, in this type of field, there are containers that include a plurality of grip sections. In order to grip such a container that includes a plurality of grip sections, it is sometimes necessary for the gripping device to be more accurately arranged at an appropriate position relative to the container before starting the gripping operation.

SUMMARY OF THE INVENTION

In view of the above circumstances, there is desire for the realization of a transport vehicle that can appropriately grip a container that includes a plurality of grip sections.

The following is technology for solving the above-described problems.

One aspect of the present invention is a transport vehicle configured to travel along a travel route and transport a container having a predetermined shape, the transport vehicle including:

a gripping device configured to grip the container; and an elevation device configured to raise and lower the gripping device, wherein the container includes:

a container body; and a first grip section and a second grip section that protrude upward from a body upper surface, which is an upper surface of the container body, and are configured to be gripped by the gripping device, the first grip section and the second grip section extend along a first direction, which is a specified direction parallel with the body upper surface, and are spaced apart from each other in a second direction, which is a direction parallel with the body upper surface and orthogonal to the first direction, the gripping device includes:

a gripping body section suspended from the elevation device;

a pair of grippers supported by the gripping body section;

a grip drive section configured to move the pair of grippers toward each other and away from each other in the second direction;

a first guide body supported by the gripping body section independent of the pair of grippers, and configured to guide the gripping body section relative to the first grip section; and a second guide body supported by the gripping body section independent of the pair of grippers, and configured to guide the gripping body section relative to a target grip section, which is either the first grip section or the second grip section, the first guide body includes a pair of first guide surfaces configured to be respectively located on opposite sides of the first grip section in the second direction after completion of a lowering operation for gripping, which is an operation in which the gripping device is lowered by the elevation device in order to grip the first grip section and the second grip section with the pair of grippers, the first guide body is further configured to correct a position in the second direction of the gripping body section relative to the first grip section by at least one of the pair of first guide surfaces coming into contact with the first grip section during the lowering operation for gripping, the second guide body includes a pair of second guide surfaces configured to be respectively located on opposite sides of the target grip section in the second direction after completion of the lowering operation for gripping, the second guide body is further configured to correct a position in the second direction of the gripping body section relative to the target grip section by at least one of the pair of second guide surfaces coming into contact with the target grip section during the lowering operation for gripping, and the first guide body and the second guide body are spaced apart from each other in at least either the first direction or the second direction.

According to this configuration, during the lowering operation for gripping, the first guide body comes into contact with the first grip section, and the second guide body comes into contact with the target grip section. The position in the second direction of the gripping body section relative to the first grip section is corrected by the first guide body coming into contact with the first grip section. The position in the second direction of the gripping body section relative to the target grip section is corrected by the second guide body coming into contact with the target grip section. Here, in the above configuration, the first guide body and the second guide body are spaced apart from each other in at least either the first direction or the second direction, and thus two portions of the gripping body section that are spaced apart from each other are positioned in the second direction relative to the container. As a result, the position of the gripping body section in the second direction and the angle of the gripping body section around the vertical axis can be corrected based on the first grip section and the second grip section of the container. Therefore, even if the position of the gripping device in the second direction and the angle of the gripping device around the vertical axis deviate from the appropriate position relative to the container, such deviation can be corrected by the lowering operation for gripping, and the gripping device can be arranged at an appropriate position relative to the container. The gripping device can then start the gripping of the container. Therefore, according to the above configuration, it is possible to appropriately grip a container that includes a plurality of grip sections.

Further features and advantages of the technology according to the present disclosure will become more apparent from the following description of illustrative and non-limiting embodiments given with reference to the drawings.

DESCRIPTION OF THE INVENTION

A transport vehicle according to an aspect of the present disclosure is configured to travel along a travel route and transport a container having a predetermined shape. Hereinafter, embodiments of the transport vehicle will be described by way of examples of the case where the transport vehicle is applied to a transport facility.

First Embodiment

First, a first embodiment of the transport vehicle will be described.

Figure 1:
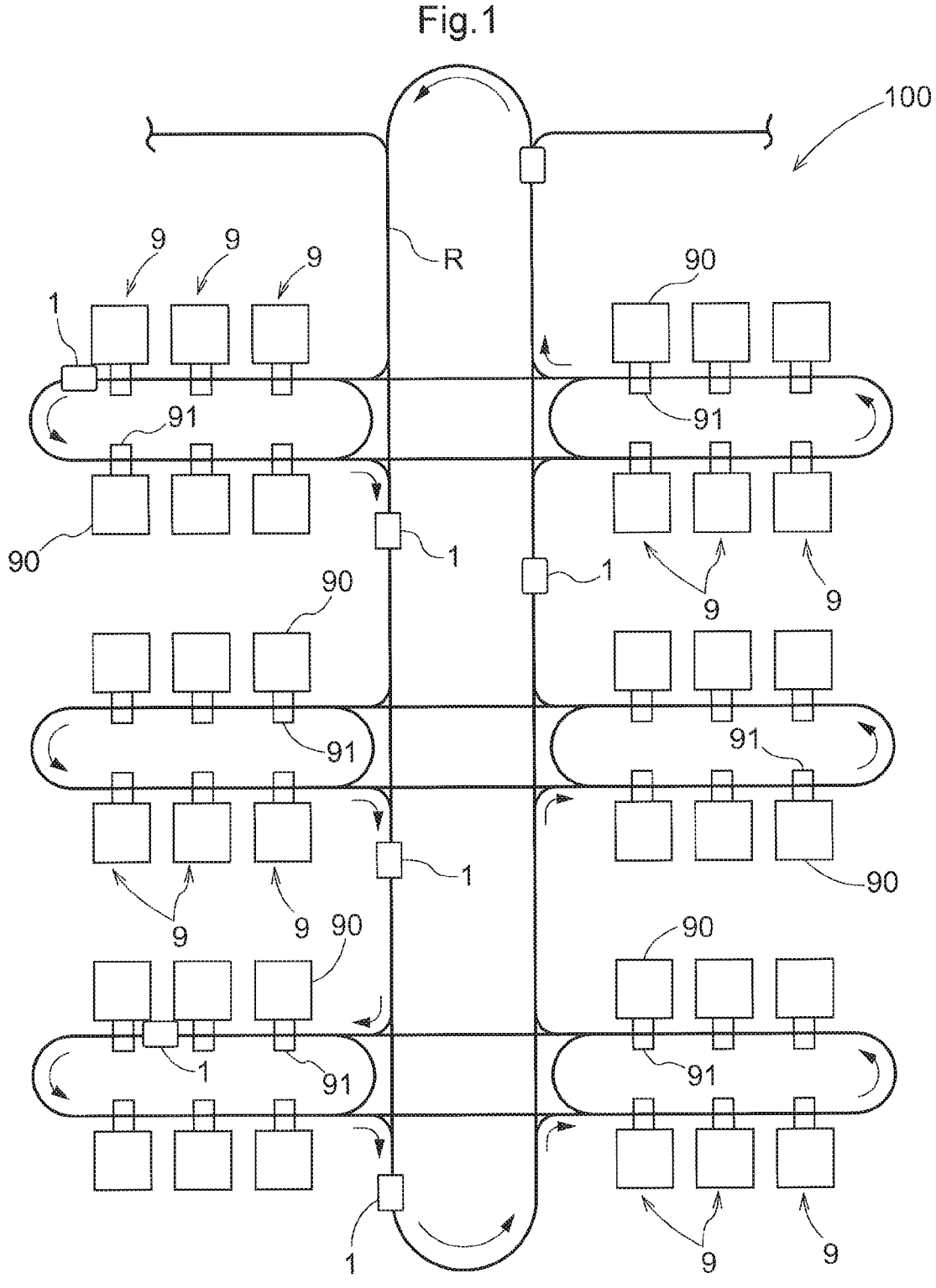
FIG. 1 is a plan view of a transport facility.
Figure 2:
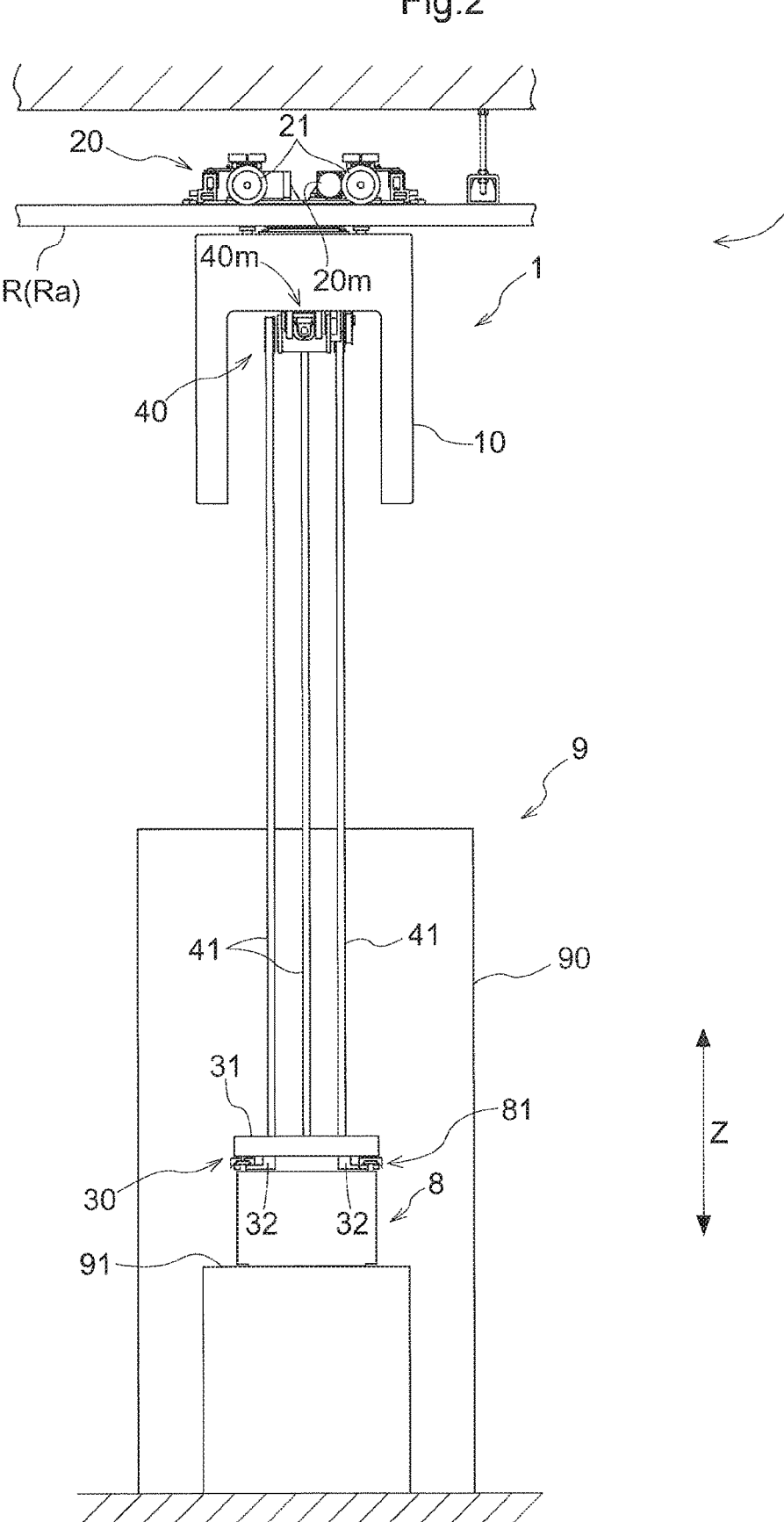
FIG. 2 is a diagram showing a transfer operation.

As shown in FIGS. 1 and 2, a transport facility 100 includes a predetermined travel route R, transport vehicles 1 that travel along the travel route R and transport containers 8, and a plurality of target transfer locations 9 provided along the travel route R.

The travel route R is set at a position spaced upward from the floor surface. In this example, the travel route R is configured using a rail Ra provided near the ceiling. The transport vehicles 1 are each configured as a so-called overhead transport vehicle, and travel along the rail Ra. The target transfer locations 9 are arranged below the travel route R. The transport vehicles 1 transfer the containers 8 to and from the target transfer locations 9 by raising and lowering the containers 8.

In the present embodiment, the transport facility 100 includes a plurality of transport vehicles 1. The transport vehicles 1 are each configured to receive transport commands from a host control device (not shown) that performs overall management of the facility, and to execute tasks in accordance with the transport commands. For example, the transport command may include information regarding a transport source and a transport destination of a container 8. After receiving a transport command, the transport vehicle 1 transports the container 8 from the transport source to the transport destination. The transport source and the transport destination may be the target transfer locations 9.

Various types of containers 8 can be handled in the transport facility 100. In this example, the transport facility 100 is used in a semiconductor manufacturing factory. For this reason, examples of the containers 8 include a substrate storage container (so-called FOUP: Front Opening Unified Pod) that stores a substrate (e.g., a wafer or a panel), and a reticle storage container (so-called reticle pod) that stores a reticle. In this case, the transport vehicles 1 transport the containers 8, which are substrate storage containers or reticle storage containers, along the travel route R during manufacturing steps.

In the present embodiment, the target transfer locations 9 include processing devices 90 that perform processing on the containers 8, and placement tables 91 arranged adjacent to the processing devices 90. In this specification, the aforementioned processing performed on the containers 8 means processing performed on the objects stored in the containers 8 (i.e., substrates or reticles). The transport vehicles 1 each receive a container 8 that has been processed by a processing device 90 from the corresponding placement table 91, and deliver a container 8 that has not been processed by a processing device 90 to the corresponding placement table 91. Note that the processing devices 90 perform various types of processing such as thin film formation, photolithography, and etching.

As shown in FIG. 2, each of the transport vehicles 1 includes a travel device 20 that travels on the rail Ra, and a storage section 10 that stores the container 8. The transport vehicle 1 also includes a gripping device 30 that grips the container 8, and an elevation device 40 that raises and lowers the gripping device 30.

The travel device 20 is configured to move the transport vehicle 1 along the travel route R by traveling on the rail Ra. In the present embodiment, the travel device 20 includes a plurality of travel wheels 21 that roll on the rail Ra, and a travel drive section 20*m* that drives at least one of the travel wheels 21. For example, the travel drive section 20*m* is configured using an electric motor.

The storage section 10 is able to store the container 8 that is to be transported. In the present embodiment, the storage section 10 is suspended from the travel device 20, and is disposed below the rail Ra. The storage section 10 is able to store the container 8 gripped by the gripping device 30. The container 8 is stored in the storage section 10 while the transport vehicle 1 transports the container 8 along the travel route R.

The elevation device 40 is configured to raise the gripping device 30 between the storage section 10 and the target transfer location 9 located below the travel route R. In the present embodiment, the elevation device 40 includes elevation belts 41 that are connected to the gripping device 30, and an elevation drive section 40m that drives the elevation belts 41. The elevation drive section 40m includes a rotating body around which the elevation belts 41 are wound, and a drive source that rotates the rotating body. As the rotating body rotates in the normal direction or in the reverse direction, the elevation belts 41 are wound up or fed out. As a result, the gripping device 30 connected to the elevation belts 41 moves up and down.

The gripping device 30 is able to grip the container 8. The gripping device 30 includes a gripper body section 31 suspended from the elevation device 40, a pair of grippers 32 supported by the gripper body section 31, and a grip drive section 30m that drives the pair of grippers 32 (see FIG. 5). The detailed configuration of the gripping device 30 will be described later.

Next, the container 8 will be described. As described above, the container 8 is a container for storing an object.

Figure 3:
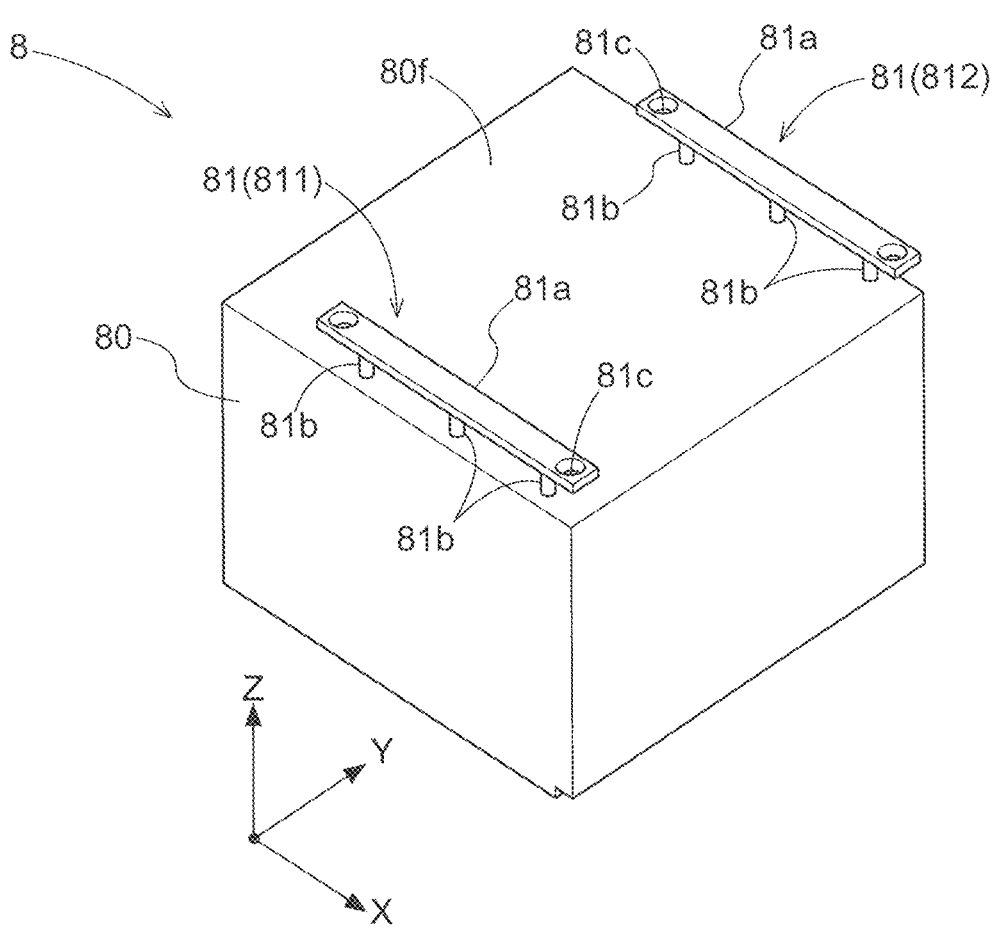
FIG. 3 is a perspective view of a container as viewed from above.

As shown in FIG. 3, the container 8 includes a container body 80 and a pair of grip sections 81 provided so as to protrude upward from a body upper surface 80f, which is the upper surface of the container body 80. The pair of grip sections 81 are configured to be gripped by the gripping device 30. One of the grip sections 81 is a first grip section 811, and the other one is a second grip section 812. The container body 80 is the portion in which an object is stored, and is shaped as a box.

In this specification, a "first direction X" is a specified direction parallel to the body upper surface 80f, and a "second direction Y" is a direction that is parallel to the body upper surface 80f and orthogonal to the first direction X. In the present embodiment, the container 8 is gripped by the gripping device 30 such that the second direction Y conforms to the traveling direction of the transport vehicle 1.

The first grip section 811 and the second grip section 812 each extend along the first direction X, and are spaced apart from each other in the second direction Y. In the present embodiment, the first grip section 811 and the second grip section 812 each include a grip body section 81a that is spaced upward from the body upper surface 80f and is shaped as a narrow plate extending along the first direction X, and connecting sections 81b that connect the grip body section 81a to the body upper surface 80f.

A positioning recession 81c is formed in the upper surface of at least either the first grip section 811 or the second grip section 812. When the gripping device 30 grips the grip sections 81, a positioning body 37 (described later) of the gripping device 30 engages with the positioning recession 81c. In other words, the positioning recession 81c has a function of positioning the gripping device 30 relative to the container 8. In the present embodiment, a positioning recession 81c is formed in both the first grip section 811 and the second grip section 812. In the illustrated example, two positioning recessions 81c are formed in the grip body section 81a of the first grip section 811. Two positioning recessions 81c are formed in the grip body section 81a of the second grip section 812.

The connecting sections 81b of each grip section 81 are arranged at intervals in the first direction X. In the illustrated example, three connecting sections 81b are arranged at equal intervals. Although this will be described in detail later, the intervals between the connecting sections 81b are set such that grippers 32 of the gripping device 30 can pass between them.

Next, the structure of the gripping device 30 will be described in detail. As shown in FIG. 2, the gripping device 30 is able to grip the pair of grip sections 81 of the container 8. Before gripping the pair of grip sections 81, the gripping device 30 needs to approach the container 8 located at the target transfer location 9 from above. As mentioned above, the gripping device 30 is lowered by the elevation device 40. Here, the term "lowering operation for gripping" will be used to refer to the operation of lowering the gripping device 30 by the elevation device 40 in order to grip the pair of grip sections 81 with the pair of grippers 32.

Figure 4:
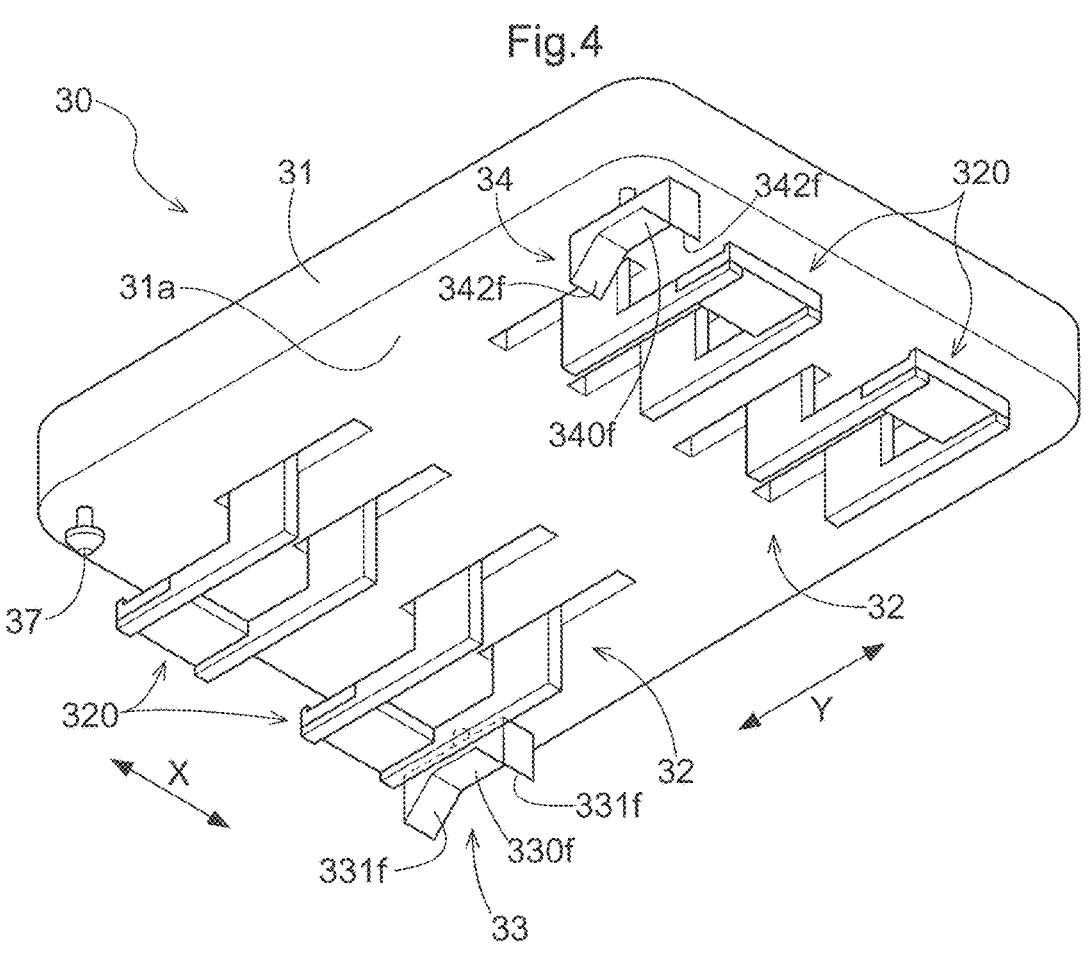
FIG. 4 is a perspective view of a gripping device as viewed from below.
Figure 5:
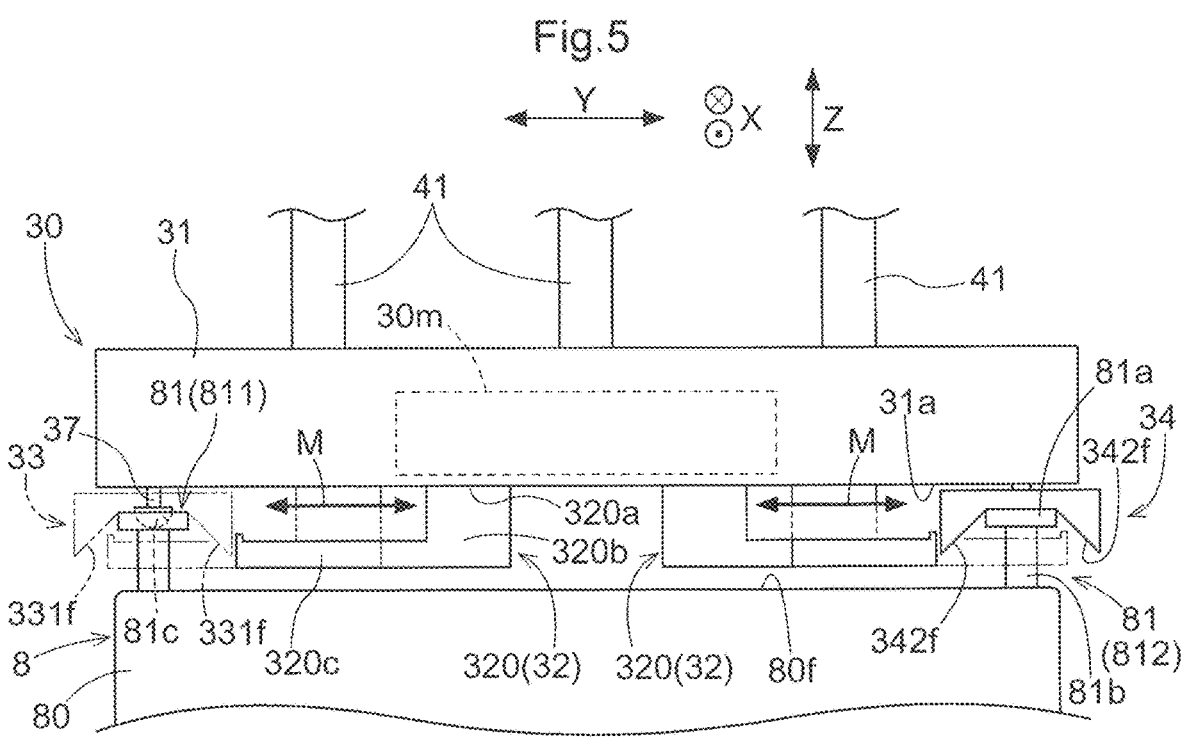
FIG. 5 is a diagram showing a gripping operation.

As shown in FIGS. 4 and 5, the gripping device 30 includes the gripper body section 31, the pair of grippers 32, and the grip drive section 30m that moves the pair of grippers 32 toward each other and away from each other in the second direction Y. For example, the grip drive section 30m includes a linear motion mechanism that linearly moves the pair of grippers 32, an electric motor serving as a drive source, and the like.

As shown in FIG. 4, in the present embodiment, each of the grippers 32 includes a plurality of gripping claws 320. In other words, each gripper 32 is configured using a plurality of gripping claws 320. In the example shown in FIG. 4, two gripping claws 320 constitute one gripper 32. The plurality of (two in this example) gripping claws 320 constituting one gripper 32 are arranged next to each other along the first direction X, and are configured to grip one grip section 81 extending in the first direction X.

As shown in FIG. 5, each of the gripping claws 320 includes a supported section 320a supported by the gripper body section 31, a base section 320b extending downward from the supported section 320a, and an extension section 320c extending in the second direction Y from the base section 320b. In this example, the gripping claw 320 is overall L-shaped when viewed in the first direction X, due to the supported section 320a, the base section 320b, and the extension section 320c.

In the present embodiment, while located between the first grip section 811 and the second grip section 812 in the second direction Y, the pair of grippers 32 are driven by the grip drive section 30m so as to separate from each other along the second direction Y (hereinafter simply referred to as a "separating operation"). In other words, the gripping device 30 arranges the pair of grippers 32 between the first grip section 811 and the second grip section 812 in the second direction Y, and causes the pair of grippers 32 to perform the separating operation. The gripping device 30 grips the container 8 by causing the pair of grippers 32 to perform the separating operation. In this way, in the present embodiment, the gripping device 30 is configured to use the pair of grippers 32 to grip the first grip section 811 and the second grip section 812 from inside in the second direction Y.

As shown by virtual lines in FIG. 5, in the separating operation, the pair of grippers 32 each move by a predetermined movement amount M in the second direction Y. Due to the separating operation, the extension sections 320c of the gripping claws 320 are arranged at positions facing the grip body sections 81a of the grip sections 81 from below. The gripping device 30 in this state is raised by the elevation device 40 such that the first grip section 811 is placed on the extension sections 320c of one of the grippers 32, and the second grip section 812 is placed on the extension sections 320c of the other one of the grippers 32. In this way, the gripping device 30 grips the container 8.

In the present embodiment, the gripping device 30 includes a positioning body 37 that engages with one of the positioning recessions 81c so as to position the gripping device 30 relative to the positioning recession 81c. The positioning body 37 protrudes downward from a bottom section 31a of the gripping body section 31. The leading end portion of the positioning body 37 has a shape corresponding to the positioning recessions 81c.

As described above, when the gripping device 30 grips the grip sections 81, the positioning body 37 engages with one of the positioning recessions 81c. In the present embodiment, two positioning recessions 81c are provided in each of the pair of grip sections 81, and thus a total of four positioning recessions 81c are provided in the container 8. The gripping device 30 need only include at least one positioning body 37 that engages with at least one of these four positioning recessions 81c. In this example, the gripping device 30 includes only one positioning body 37 (see FIG. 4). However, the present invention is not limited to this, and the gripping device 30 may include two or more positioning bodies 37, up to the number of positioning recessions 81c provided in the container 8.

Figures 6, 7:
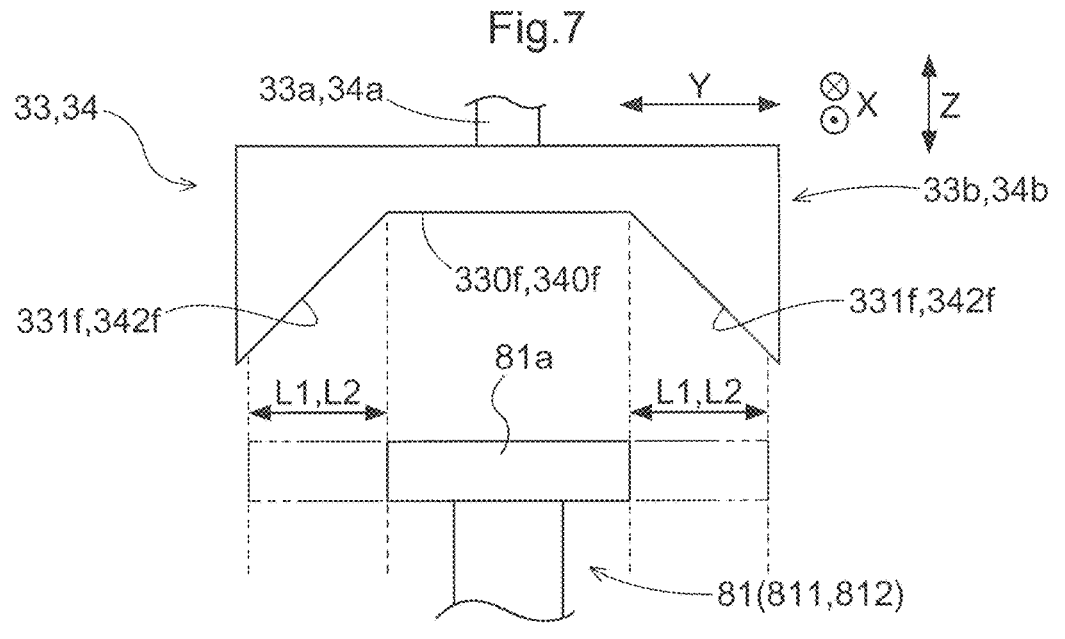
FIG. 6 is a plan view showing positions where a first guide body and a second guide body are arranged.
FIG. 7 is a diagram showing a first allowable deviation amount and a second allowable deviation amount.

As shown in FIGS. 4 to 6, the gripping device 30 includes a first guide body 33, which is supported by the gripping body section 31 independent of the pair of grippers 32 and guides the gripping body section 31 relative to the first grip section 811, and further includes a second guide body 34, which is supported by the gripping body section 31 independent of the pair of grippers 32 and guides the gripping body section 31 relative to a target grip section, which is either the first grip section 811 or the second grip section 812. Note that in this example, the target grip section is the second grip section 812. The second guide body 34 is configured to guide the gripping body section 31 relative to the second grip section 812 serving as the target grip section.

The first guide body 33 is configured to guide the gripping body section 31 relative to the first grip section 811 before the gripping device 30 grips the container 8. The second guide body 34 is configured to guide the gripping body section 31 relative to the target grip section (second grip section 812) before the gripping device 30 grips the container 8. Due to the first guide body 33 and the second guide body 34 guiding the gripping body section 31 relative to the first grip section 811 and the target grip section (second grip section 812), the gripping device 30 can be arranged at an appropriate position relative to the container 8. Thereafter, the gripping device 30 arranged at the appropriate position can perform an appropriate gripping operation on the container 8.

The first guide body 33 and the second guide body 34 are spaced apart from each other in at least either the first direction X or the second direction Y. In the present embodiment, the first guide body 33 and the second guide body 34 are spaced apart from each other in the first direction X, and are also spaced apart from each other in the second direction Y. In other words, the first guide body 33 and the second guide body 34 are arranged at diagonally opposite corners when viewed in the up-down direction (see FIG. 6). According to this configuration, the first guide body 33 and the second guide body 34 can be spaced as far apart as possible. Due to the gripping body section 31 being positioned by the first guide body 33 and the second guide body 34, two portions of the gripping body section 31 that are as far apart as possible are positioned relative to the container 8. This makes it easy to arrange the gripping device 30 at an appropriate position relative to the container 8.

The first guide body 33 includes a pair of first guide surfaces 331f that are arranged on opposite sides of the first grip section 811 in the second direction Y after completion of the lowering operation for gripping. The first guide body 33 is configured to correct the position in the second direction Y of the gripping body section 31 relative to the first grip section 811 by at least one of the first guide surfaces 331f coming into contact with the first grip section 811 during the lowering operation for gripping. In other words, the first guide body 33 guides the gripping body section 31 relative to the first grip section 811 by at least one of the first guide surfaces 331f coming into contact with the first grip section 811 during the lowering operation for gripping. Due to this guiding, after completion of the lowering operation for gripping, the first grip section 811 is arranged between the pair of first guide surfaces 331f in the second direction Y. As a result, the position in the second direction Y of the gripping body section 31 relative to the first grip section 811 is corrected.

The second guide body 34 includes a pair of second guide surfaces 342f that are arranged on opposite sides of the target grip section (second grip section 812) in the second direction Y after completion of the lowering operation for gripping. The second guide body 34 is configured to correct the position in the second direction Y of the gripping body section 31 relative to the target grip section (second grip section 812) by at least one of the second guide surfaces 342f coming into contact with the target grip section (second grip section 812) during the lowering operation for gripping. In other words, the second guide body 34 guides the gripping body section 31 relative to the target grip section (second grip section 812) by at least one of the second guide surfaces 342f coming into contact with the target grip section (second grip section 812) during the lowering operation for gripping. Due to this guiding, after completion of the lowering operation for gripping, the target grip section (second grip section 812) is arranged between the pair of second guide surfaces 342f in the second direction Y. As a result, the position in the second direction Y of the gripping body section 31 relative to the target grip section (second grip section 812) is corrected.

FIG. 7 shows an enlargement of the first guide body 33 and the second guide body 34. The first guide body 33 and the second guide body 34 have the same structure. The first guide body 33 and the second guide body 34 are thus represented by one member in FIG. 7.

In the present embodiment, the first guide body 33 includes a first opposing surface 330f that opposes the first grip section 811 in the up-down direction after completion of the lowering operation for gripping. The pair of first guide surfaces 331f are continuous with the first opposing surface 330f. The first guide surfaces 331f extend in the second direction Y from opposite end portions of the first opposing surface 330f in the second direction Y. The pair of first guide surfaces 331f guide the first grip section 811 (specifically, the grip body section 81a) toward the first opposing surface 330f by coming into contact with the first grip section 811 during the lowering operation for gripping.

In the present embodiment, the first guide surfaces 331f are shaped as flat surfaces inclined so as to approach each other while extending upward. In this example, upper end portions of the first guide surfaces 331f are continuous with the first opposing surface 330f. According to this configuration, as the lowering operation for gripping continues while either one of the first guide surfaces 331f is in contact with the grip body section 81a, the grip body section 81a moves relative to the pair of first guide surfaces 331f, toward an intermediate position (here, the first opposing surface 330f) between the pair of first guide surfaces 331f in the second direction Y. The position of the first guide body 33 in the second direction Y is thus corrected, and in turn, the position of the gripping body section 31 in the second direction Y is corrected.

In the present embodiment, the first guide surfaces 331*f* are arranged so as to extend along the first direction X during the lowering operation for gripping. As shown in FIGS. 4 and 6, each of the first guide surfaces 331*f* has an extending portion that extends in a direction orthogonal to the direction in which the first guide surfaces 331*f* are side by side. The extending portions of the first guide surfaces 331*f* are arranged so as to extend along the first direction X while the gripping device 30 is oriented in the lowering operation for gripping. This makes it easier to appropriately correct the angle of the gripping body section 31 relative to the container 8 around the vertical axis.

The second guide body 34 has a configuration similar to that of the first guide body 33. In other words, as shown in FIG. 7, in the present embodiment, the second guide body 34 includes a second opposing surface 340*f* that opposes the target grip section (second grip section 812) in the up-down direction after completion of the lowering operation for gripping. The pair of second guide surfaces 342*f* are continuous with the second opposing surface 340*f*. The second guide surfaces 342*f* extend in the second direction Y from opposite end portions of the second opposing surface 340*f* in the second direction Y. The pair of second guide surfaces 342*f* guide the target grip section (specifically, the grip body section 81*a* of the second grip section 812) toward the second opposing surface 340*f* by coming into contact with the target grip section (second grip section 812) during the lowering operation for gripping.

In the present embodiment, the second guide surfaces 342*f* are shaped as flat surfaces inclined so as to approach each other while extending upward. In this example, upper end portions of the second guide surfaces 342*f* are continuous with the second opposing surface 340*f*. According to this configuration, as the lowering operation for gripping continues while either one of the second guide surfaces 342*f* is in contact with the grip body section 81*a*, the grip body section 81*a* moves relative to the pair of second guide surfaces 342*f*, toward an intermediate position (here, the second opposing surface 340*f*) between the pair of second guide surfaces 342*f* in the second direction Y. The position of the second guide body 34 in the second direction Y is thus corrected, and in turn, the position of the gripping body section 31 in the second direction Y is corrected.

In the present embodiment, the second guide surfaces 342*f* are arranged so as to extend along the first direction X during the lowering operation for gripping. As shown in FIGS. 4 and 6, each of the second guide surfaces 342*f* has an extending portion that extends in a direction orthogonal to the direction in which the second guide surfaces 342*f* are side by side. These extending portions of each of the second guide surfaces 342*f* are arranged so as to extend along the first direction X while the gripping device 30 is oriented in the lowering operation for gripping. This makes it easier to appropriately correct the angle of the gripping body section 31 relative to the container 8 around the vertical axis.

Next, the relationship between the first guide body 33, the second guide body 34, and the positioning body 37 will be described with reference to FIGS. 7 and 8. The first guide body 33, the second guide body 34, and the positioning body 37 are provided on the gripping body section 31 (see also FIG. 4), and have a function of positioning the gripping body section 31 at an appropriate position relative to the container 8, which is the gripping target. While the gripping body section 31 is positioned at the appropriate position, the gripping device 30 starts a gripping operation for gripping the container 8.

Here, a first allowable deviation amount L1 (see FIG. 7) is the maximum amount of deviation in the second direction Y between the first guide body 33 and the first grip section 811 according to which at least one of the first guide surfaces 331*f* can come into contact with the first grip section 811. Also, a second allowable deviation amount L2 (see FIG. 7) is the maximum amount of deviation in the second direction Y between the second guide body 34 and the target grip section (second grip section 812) according to which at least one of the second guide surfaces 342*f* can come into contact with the target grip section (second grip section 812). Also, an allowable positioning deviation amount L37 (see FIG. 8) is the maximum amount of deviation in the second direction Y between the positioning body 37 and the positioning recession 81*c* according to which the positioning body 37 can engage with the positioning recession 81*c*.

As shown in FIG. 7, in the present embodiment, if there is no deviation between the first guide body 33 and the first grip section 811 in the second direction Y, the first opposing surface 330*f* of the first guide body 33 opposes the first grip section 811 in the up-down direction Z. If there is deviation between the first guide body 33 and the first grip section 811 in the second direction Y, the first grip section 811 does not come into contact with (or may partially come into contact with) either of the pair of first guide surfaces 331*f*.

In the present embodiment, the length of each of the first guide surfaces 331*f* in the second direction Y is the first allowable deviation amount L1. If the amount of deviation between the first guide body 33 and the first grip section 811 in the second direction Y is less than or equal to the first allowable deviation amount L1, as the lowering operation for gripping is performed, either one of the pair of first guide surfaces 331*f* comes into contact with the first grip section 811. As the lowering operation for gripping continues, the first grip section 811 is guided to the first opposing surface 330*f* by the first guide surface 331*f* that is in contact therewith. As a result, the first guide body 33 and the first grip section 811 move relative to each other, and the gripping body section 31 is positioned at an appropriate position relative to the container 8.

In the present embodiment, if there is no deviation between the second guide body 34 and the target grip section (second grip section 812) in the second direction Y, the second opposing surface 340*f* of the second guide body 34 opposes the target grip section (second grip section 812) in the up-down direction Z. If there is deviation between the second guide body 34 and the target grip section (second grip section 812) in the second direction Y, the target grip section (second grip section 812) does not come into contact with (or may partially come into contact with) either of the pair of second guide surfaces 342*f*.

In the present embodiment, the length of each of the second guide surfaces 342*f* in the second direction Y is the second allowable deviation amount L2. If the amount of deviation between the second guide body 34 and the target grip section (second grip section 812) in the second direction Y is less than or equal to the second allowable deviation amount L2, as the lowering operation for gripping is performed, either one of the pair of second guide surfaces 342*f* comes into contact with the target grip section (second grip section 812). As the lowering operation for gripping continues, the target grip section (second grip section 812) is guided to the second opposing surface 340*f* by the second guide surface 342*f* that is in contact therewith. As a result, the second guide body 34 and the target grip section (second grip section 812) move relative to each other, and the gripping body section 31 is positioned at an appropriate position relative to the container 8.

Figure 8:
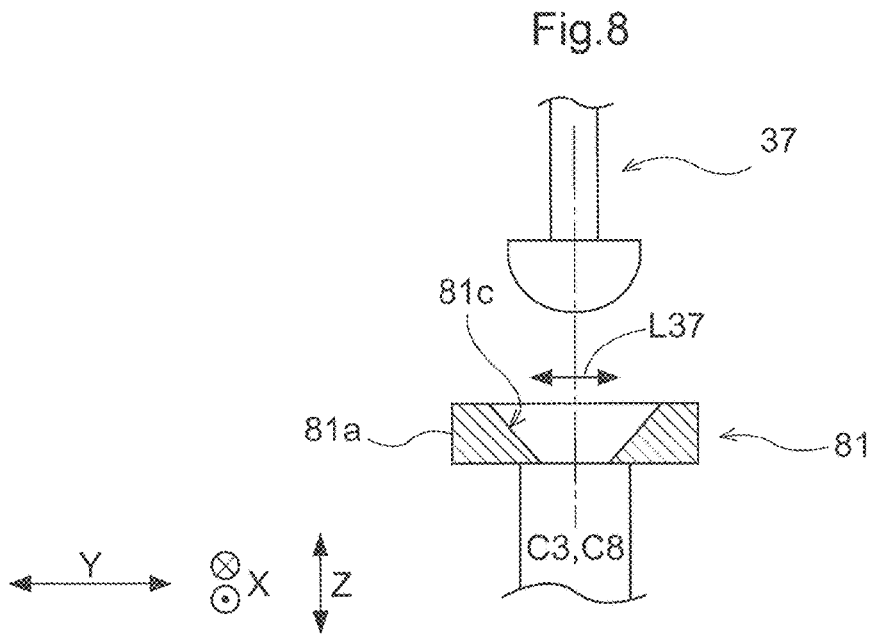
FIG. 8 is a diagram showing an allowable positioning deviation amount.

As shown in FIG. 8, the positioning body 37 (specifically, the leading end portion of the positioning body 37) and the positioning recession 81c have protruding/receding shapes that engage with each other, and both have a tapered shape or hemispherical shape so as to become narrower while extending downward. In the present embodiment, while there is no deviation between the positioning body 37 and the positioning recession 81c in the second direction Y, a center C3 of the positioning body 37 and a center C8 of the positioning recession 81c match each other.

In the present embodiment, the allowable positioning deviation amount L37 is half the length of the positioning recession 81c in the second direction Y. If the amount of deviation between the positioning body 37 and the positioning recession 81c in the second direction Y is less than or equal to the allowable positioning deviation amount L37, the positioning body 37 and the positioning recession 81c come into contact with each other during the lowering operation for gripping. As the lowering operation for gripping continues, the positioning body 37 and the positioning recession 81c move relative to each other such that the center C3 of the positioning body 37 and the center C8 of the positioning recession 81c match each other. The gripping body section 31 thus becomes positioned at an appropriate position relative to the container 8.

In the present embodiment, the first guide body 33 and the second guide body 34 are formed such that the first allowable deviation amount L1 and the second allowable deviation amount L2 (see FIG. 7) are greater than the allowable positioning deviation amount L37 (see FIG. 8). In other words, the length of the first guide surface 331f and the length of the second guide surface 342f in the second direction Y are each larger than the allowable positioning deviation amount L37. Accordingly, even if the gripping body section 31 deviates from the first grip section 811 and the target grip section (second grip section 812) in the second direction Y by an amount according to which the positioning body 37 cannot engage with the positioning recession 81c, the first grip section 811 and the target grip section (second grip section 812) can be appropriately guided by the first guide body 33 and the second guide body 34. Therefore, deviation between the positioning body 37 and the positioning recession 81c can be kept within a range in which the positioning body 37 can engage with the positioning recession 81c (i.e., less than or equal to the allowable positioning deviation amount L37).

Figure 9:
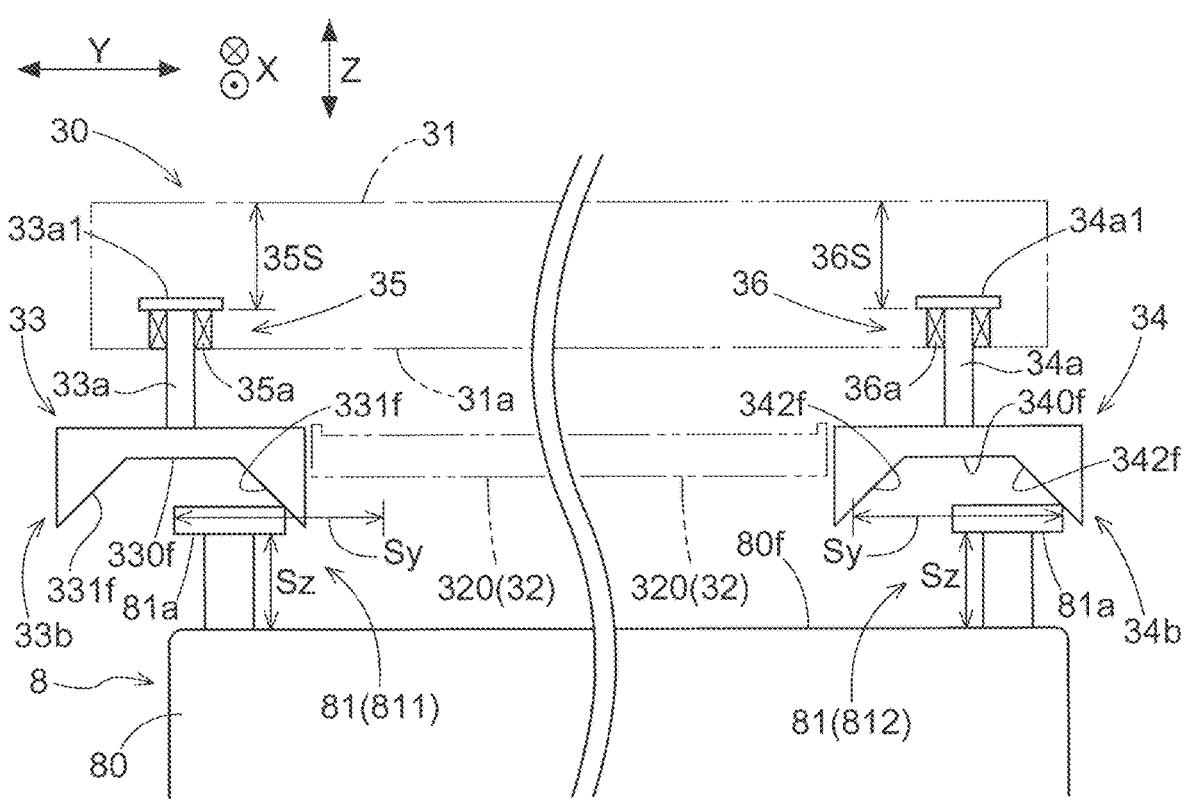
FIG. 9 is a diagram showing a state in which the first guide body and the second guide body have started to guide grip sections.

As shown in FIG. 9, in the present embodiment, the gripping device 30 includes a first support mechanism 35 that supports the first guide body 33 and a second support mechanism 36 that supports the second guide body 34.

The first support mechanism 35 is provided on the gripping body section 31 and is configured to support the first guide body 33 to the gripping body section 31.

In the present embodiment, the first support mechanism 35 is configured to restrict movement of the first guide body 33 relative to the gripping body section 31 in the first direction X and the second direction Y, and allow movement of the first guide body 33 relative to the gripping body section 31 in the up-down direction Z in a predetermined first range 35S.

In the present embodiment, the first guide body 33 includes a first shaft section 33a that passes through the bottom section 31a of the gripping body section 31 in the up-down direction Z, and a first guide section 33b connected to the lower end of the first shaft section 33a. The first support mechanism 35 includes a first bearing 35a that supports the first shaft section 33a of the first guide body 33 while allowing the first shaft section 33a to move in the up-down direction Z. The upper end of the first bearing 35a is configured to come into contact with a portion of the first shaft section 33a from below. In this example, an enlarged diameter section 33a1 that spreads out in the horizontal direction is provided in a portion of the first shaft section 33a. The enlarged diameter section 33al comes into contact with the upper end of the first bearing 35a so as to prevent the first shaft section 33a from falling from the gripping body section 31. Note that the first guide section 33b of the first guide body 33 is provided with the first opposing surface 330f and the pair of first guide surfaces 331f that were described above.

In the illustrated example, the first range 35S in which the first guide body 33 is movable in the up-down direction Z is set to a range from the upper end of the first bearing 35a to the upper end of the gripping body section 31. However, this is merely an example, and the first range 35S may be set based on other sections. For example, the first range 35S may be set to a range from the first guide section 33b to the bottom section 31a of the gripping body section 31 in the state where the first guide body 33 protrudes the maximum amount.

In the present embodiment, the second support mechanism 36 is configured to restrict movement of the second guide body 34 relative to the gripping body section 31 in the first direction X and the second direction Y, and allow movement of the second guide body 34 relative to the gripping body section 31 in the up-down direction Z in a predetermined second range 36S.

In the present embodiment, the second guide body 34 includes a second shaft section 34a that passes through the bottom section 31a of the gripping body section 31 in the up-down direction Z, and a second guide section 34b connected to the lower end of the second shaft section 34a. The second support mechanism 36 includes a second bearing 36a that supports the second shaft section 34a of the second guide body 34 while allowing the second shaft section 34a to move in the up-down direction Z. The upper end of the second bearing 36a is configured to come into contact with a portion of the second shaft section 34a from below. In this example, an enlarged diameter section 34a1 that spreads out in the horizontal direction is provided in a portion of the second shaft section 34a. The enlarged diameter section 34al comes into contact with the upper end of the second bearing 36a so as to prevent the second shaft section 34a from falling from the gripping body section 31. Note that the second guide section 34b of the second guide body 34 is provided with the second opposing surface 340f and the pair of second guide surfaces 342f that were described above.

In the illustrated example, the second range 36S in which the second guide body 34 is movable in the up-down direction Z is set to a range from the upper end of the second bearing 36a to the upper end of the gripping body section 31. However, this is merely an example, and the second range 36S may be set based on other sections. For example, the second range 36S may be set to a range from the second guide section 34b to the bottom section 31a of the gripping body section 31 in the state where the second guide body 34 protrudes the maximum amount.

Next, the case where the first guide body 33 and the second guide body 34 guide the first grip section 811 and the target grip section (the second grip section 812) during the lowering operation for gripping will be described with reference to FIGS. 9 to 11. Note that members not necessary for the description, such as the positioning body 37, are not shown in FIGS. 9 to 11.

Hereinafter, "reference range in the up-down direction" refers to the range of relative positions in the up-down direction Z of the gripping device 30 relative to the container 8 at which the first grip section 811 and the second grip section 812 can be gripped by the pair of grippers 32. In the present embodiment, the gripping device 30 is arranged in the reference range in the up-down direction such that the pair of grippers 32 are each arranged in a gripping up-down range Sz set between the container body 80 and the grip body sections 81a in the up-down direction Z. In other words, the above-mentioned reference range in the up-down direction is the range in the up-down direction Z of the gripping device 30 in which the pair of grippers 32 are each arranged in the gripping up-down range Sz.

Also, hereinafter, "reference range in the second direction" refers to the range of relative positions in the second direction Y of the gripping device 30 relative to the container 8 at which the first grip section 811 and the second grip section 812 can be gripped by the pair of grippers 32. In the present embodiment, the gripping device 30 is arranged in the reference range in the second direction such that the pair of grippers 32 are each arranged in a gripping second direction range Sy set based on the positions of the grip sections 81. In other words, the above-mentioned reference range in the second direction is the range in the second direction Y of the gripping device 30 in which the pair of grippers 32 are each arranged in the gripping second direction range Sy. Note that in this example, the gripping second direction range Sy is set so as to extend inward in the second direction Y from the grip section 81 (specifically the outward end portion of the grip section 81 in the second direction Y) by a distance based on the movement amount M by which the gripping body 32 moves in the second direction Y for the gripping operation (see FIG. 5).

As shown in FIG. 9, the first guide body 33 starts to guide the first grip section 811 while the gripping device 30 is located higher than the reference range in the up-down direction. Specifically, during the lowering operation for gripping, while the gripper 32 is located higher than the gripping up down range Sz, the first guide body 33 comes into contact with the first grip section 811 and starts to guide the first grip section 811. The first grip section 811 comes into contact with one of the two first guide surfaces 331f, and moves in the second direction Y along the first guide surface 331f relative to the one first guide surface 331f.

Similarly, while the gripping device 30 is located above the reference range in the up-down direction, the second guide body 34 starts guiding the target grip section (second grip section 812). Specifically, during the lowering operation for gripping, while the gripper 32 is located above the gripping up-down range Sz, the second guide body 34 comes into contact with the target grip section (second grip section 812) and starts to guide the target grip section (second grip section 812). The target grip section (second grip section 812) comes into contact with one of the two second guide surfaces 342f, and moves along the second guide surface 342f in the second direction Y relative to the one second guide surface 342f.

Figures 10, 11:
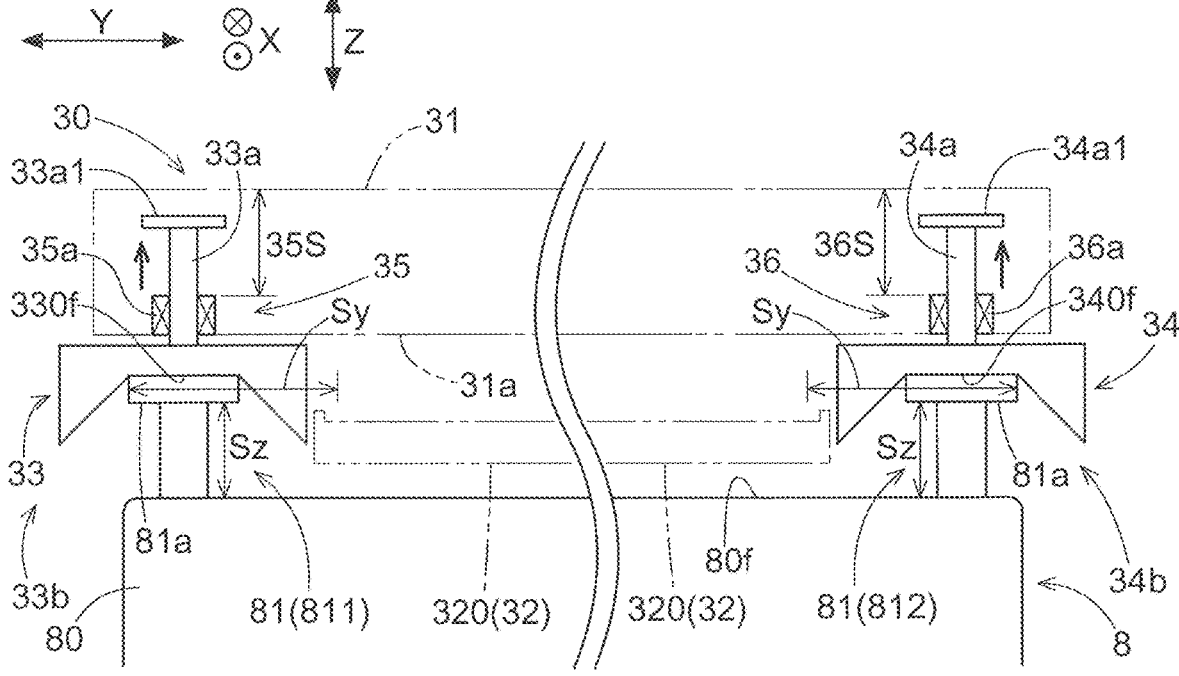
FIG. 10 is a diagram showing a state in which the gripping device is located in a reference range in a second direction.
FIG. 11 is a diagram showing a state in which the gripping device is located in a reference range in an up-down direction.

As shown in FIG. 10, the first guide body 33 guides the first grip section 811 from the first guide surface 331f toward the first opposing surface 330f. As a result, the first grip section 811 faces the first opposing surface 330f in the up-down direction Z. Similarly, the second guide body 34 guides the target grip section (second grip section 812) from the second guide surface 342f toward the second opposing surface 340f. As a result, the target grip section (second grip section 812) faces the second opposing surface 340f in the up-down direction Z.

As shown in FIG. 11, the lowering operation for gripping continues even after the first opposing surface 330f and the first grip section 811 are arranged so to face each other, and thus the first guide body 33 is pushed upward by the first grip section 811 and moves upward relative to the gripping body section 31 in the first range 35S. In other words, the first guide body 33 retracts into the gripping body section 31. The gripping body 32 can thus be appropriately arranged in the gripping up-down range Sz.

Similarly, the lowering operation for gripping continues even after the second opposing surface 340f and the target grip section (second grip section 812) are arranged so to face each other, and thus the second guide body 34 is pushed upward by the target grip section (second grip section 812) and moves upward relative to the gripping body section 31 in the second range 36S. In other words, the second guide body 34 retracts into the gripping body section 31. The gripping body 32 can thus be appropriately arranged in the gripping up down range Sz.

In the state shown in FIG. 11, the gripping device 30 is arranged in the reference range in the up-down direction and in the reference range in the second direction. Thereafter, the gripping device 30 grips the pair of grip sections 81 by moving the pair of grippers 32 away from each other along the second direction Y.

As described above with reference to FIGS. 9 to 11, in the present embodiment, the first guide body 33 is configured to guide the gripping body section 31 relative to the first grip section 811 in the second direction Y such that the gripping device 30 is arranged in the reference range in the second direction while the gripping device 30 is located in the reference range in the up-down direction. In other words, the first guide body 33 is configured to guide the gripping body section 31 relative to the first grip section 811 such that the pair of grippers 32 are arranged in the gripping up-down range Sz and in the gripping second direction range Sy.

Similarly, the second guide body 34 is configured to guide the gripping body section 31 relative to the target grip section (second grip section 812) in the second direction Y such that the gripping device 30 is arranged in the reference range in the second direction while the gripping device 30 is located in the reference range in the up-down direction. In other words, the second guide body 34 is configured to guide the gripping body section 31 relative to the target grip section (second grip section 812) such that the pair of grippers 32 are arranged in the gripping up-down range Sz and in the gripping second direction range Sy.

Second Embodiment

Next, a second embodiment of the transport vehicle will be described. In the second embodiment, the first guide body 33 and the second guide body 34 have configurations different from the first embodiment. The description given below in the second embodiment focuses on differences from the first embodiment. Aspects that are not particularly described below are similar to those in the first embodiment.

Here, "first side X1 in the first direction" refers to one side in the first direction X, and "second side X2 in the first direction" refers to the other side in the first direction X.

Figure 12:
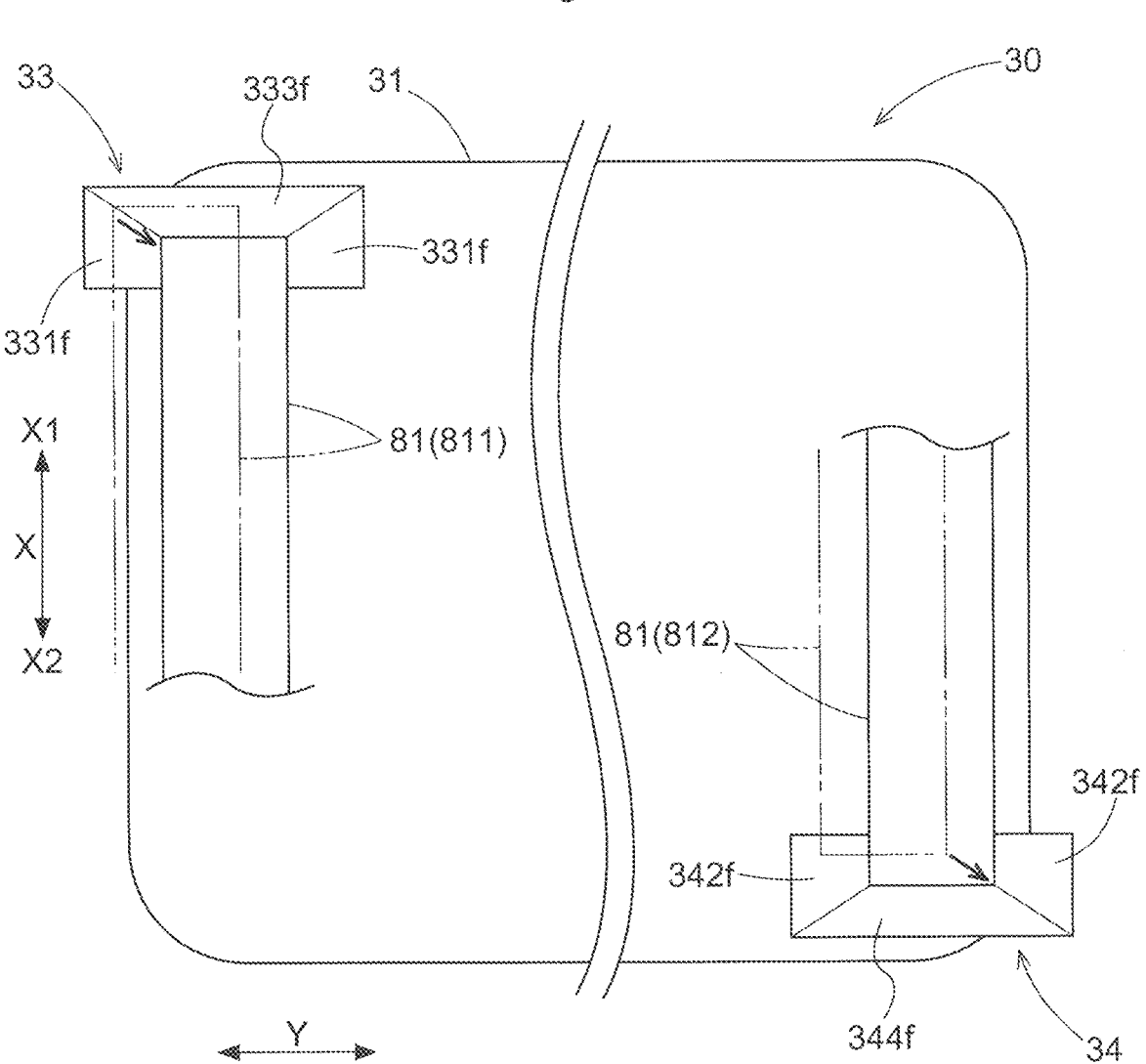
FIG. 12 is a vertical view showing a first guide body and a second guide body according to a second embodiment.

FIG. 12 shows the engaged state of the first grip section 811 and the first guide body 33 and the engaged state of the target grip section (second grip section 812) and the second guide body 34, as viewed from below. In FIG. 12, only the relevant configurations of the present embodiment are shown, and other configurations that do not require description are not shown.

As shown in FIG. 12, in the present embodiment, the first guide body 33 includes a third guide surface 333f that is located on the first side X1 in the first direction of the first grip section 811 after completion of the lowering operation for gripping. The third guide surface 333f is shaped as a flat surface inclined toward the second side X2 in the first direction while extending upward. In this example, the third guide surface 333f is continuous with both of the first guide surfaces 331f. According to this configuration, after completion of the lowering operation for gripping, the end portion of the first grip section 811 on the first side X1 in the first direction is surrounded by the first guide body 33 on the first side X1 in the first direction and on both sides in the second direction Y.

In the present embodiment, the second guide body 34 includes a fourth guide surface 344f that is located on the second side X2 in the first direction of the target grip section (second grip section 812) after completion of the lowering operation for gripping. The fourth guide surface 344f is shaped as a flat surface that is inclined toward the first side X1 in the first direction while extending upward. In this example, the fourth guide surface 344f is continuous with both of the second guide surfaces 342f. According to this configuration, after completion of the lowering operation for gripping, the end portion of the target grip section (second grip section 812) on the second side X2 in the first direction is surrounded by the second guide body 34 on the second side X2 in the first direction and on both sides in the second direction Y.

Also, due to at least either the third guide surface 333f coming into contact with the first grip section 811 or the fourth guide surface 344f coming into contact with the target grip section (second grip section 812), the position of the gripping body section 31 (not shown) in the first direction X relative to the first grip section 811 and the target grip section (second grip section 812) is corrected. In the present embodiment, correction of the position of the gripping body section 31 in the first direction X is achieved by both the third guide surface 333f coming into contact with the first grip section 811 and the fourth guide surface 344f coming into contact with the target grip section (second grip section 812).

Note that due to the lowering operation for gripping, in addition to the third guide surface 333f, either one of the two first guide surfaces 331f also comes into contact with the first grip section 811, and in addition to the fourth guide surface 344f, either one of the two second guide surfaces 342f also comes into contact with the target grip section (second grip section 812). Therefore, in the present embodiment, in addition to the position of the gripping body section 31 in the first direction X, the position of the gripping body section 31 in the second direction Y is also corrected. As a result, as the lowering operation for gripping is performed, the first grip section 811 and the target grip section (second grip section 812), which are shown by virtual lines in FIG. 12, move along the first direction X and the second direction Y relative to the first grip section 811 and the target grip section (second grip section 812), as shown by solid lines.

Other Embodiments

Next, other embodiments of the transport vehicle will be described.

(1) In the above embodiment, an example is described in which the gripping device 30 includes the first support mechanism 35 that supports the first guide body 33 so as to be movable in the up-down direction Z, and the second support mechanism 36 that supports the second guide body 34 so as to be movable in the up-down direction Z. However, the present invention is not limited to this example, and the first guide body 33 and the second guide body 34 may be fixed to the gripping body section 31 so as not to be movable in the up-down direction Z.

(2) In the above embodiment, an example is described in which the target grip section is the second grip section 812, and the second guide body 34 corrects the position in the second direction Y of the gripping body section 31 relative to the second grip section 812. However, the present invention is not limited to this example, and a configuration is possible in which the target grip section is the first grip section 811, and the second guide body 34 corrects the position in the second direction Y of the gripping body section 31 relative to the first grip section 811. In this case, the position in the second direction Y of the gripping body section 31 relative to the first grip section 811 is corrected by both the first guide body 33 and the second guide body 34.

(3) In the above embodiment, an example is described in which the first guide body 33 and the second guide body 34 are spaced apart from each other in the first direction X and also spaced apart from each other in the second direction Y. However, the present invention is not limited to this example, and the first guide body 33 and the second guide body 34 may be separated from each other in only either the first direction X or the second direction Y. In this case, the first guide body 33 and the second guide body 34 may be integrated with each other and constituted by the same member. For example, the upper portion of the first guide section 33b (the portion above the first opposing surface 330f) and the upper portion of the second guide section 34b (the portion above the second opposing surface 340f) may be connected by a connecting section that is integrated with the first guide section 33b and the second guide section 34b.

(4) In the above embodiment, an example is described in which the gripping device 30 grips the first grip section 811 and the second grip section 812 from the inside in the second direction Y by causing the pair of grippers 32 to move away from each other. However, the present invention is not limited to this example, and the gripping device 30 may grip the first grip section 811 and the second grip section 812 from the outside in the second direction Y by causing the pair of grippers 32 to move toward each other.

(5) Note that the configurations disclosed in the embodiments described above can also be applied in combination with configurations disclosed in other embodiments, as long as no contradiction arises. Regarding such other configurations as well, the embodiments disclosed herein are merely illustrative in all respects. Therefore, various modifications can be made as appropriate without departing from the spirit of the present disclosure.

Overview of Embodiments

The following is a description of aspects of the transport vehicle described above.

One aspect of the present invention is a transport vehicle configured to travel along a travel route and transport a container having a predetermined shape, the transport vehicle including:

a gripping device configured to grip the container; and an elevation device configured to raise and lower the gripping device, wherein the container includes:

a container body; and a first grip section and a second grip section that protrude upward from a body upper surface, which is an upper surface of the container body, and are configured to be gripped by the gripping device, the first grip section and the second grip section extend along a first direction, which is a specified direction parallel with the body upper surface, and are spaced apart from each other in a second direction, which is a direction parallel with the body upper surface and orthogonal to the first direction, the gripping device includes:

a gripping body section suspended from the elevation device;

a pair of grippers supported by the gripping body section;

a grip drive section configured to move the pair of grippers toward each other and away from each other in the second direction;

a first guide body supported by the gripping body section independent of the pair of grippers, and configured to guide the gripping body section relative to the first grip section; and a second guide body supported by the gripping body section independent of the pair of grippers, and configured to guide the gripping body section relative to a target grip section, which is either the first grip section or the second grip section, the first guide body includes a pair of first guide surfaces configured to be respectively located on opposite sides of the first grip section in the second direction after completion of a lowering operation for gripping, which is an operation in which the gripping device is lowered by the elevation device in order to grip the first grip section and the second grip section with the pair of grippers, the first guide body is further configured to correct a position in the second direction of the gripping body section relative to the first grip section by at least one of the pair of first guide surfaces coming into contact with the first grip section during the lowering operation for gripping, the second guide body includes a pair of second guide surfaces configured to be respectively located on opposite sides of the target grip section in the second direction after completion of the lowering operation for gripping, the second guide body is further configured to correct a position in the second direction of the gripping body section relative to the target grip section by at least one of the pair of second guide surfaces coming into contact with the target grip section during the lowering operation for gripping, and the first guide body and the second guide body are spaced apart from each other in at least either the first direction or the second direction.

According to this configuration, during the lowering operation for gripping, the first guide body comes into contact with the first grip section, and the second guide body comes into contact with the target grip section. The position in the second direction of the gripping body section relative to the first grip section is corrected by the first guide body coming into contact with the first grip section. The position in the second direction of the gripping body section relative to the target grip section is corrected by the second guide body coming into contact with the target grip section. Here, in the above configuration, the first guide body and the second guide body are spaced apart from each other in at least either the first direction or the second direction, and thus two portions of the gripping body section that are spaced apart from each other are positioned in the second direction relative to the container. As a result, the position of the gripping body section in the second direction and the angle of the gripping body section around the vertical axis can be corrected based on the first grip section and the second grip section of the container. Therefore, even if the position of the gripping device in the second direction and the angle of the gripping device around the vertical axis deviate from the appropriate position relative to the container, such deviation can be corrected by the lowering operation for gripping, and the gripping device can be arranged at an appropriate position relative to the container. The gripping device can then start the gripping of the container. Therefore, according to the above configuration, it is possible to appropriately grip a container that includes a plurality of grip sections.

It is preferable that the gripping device further includes:

a first support mechanism supporting the first guide body; and a second support mechanism supporting the second guide body, the first support mechanism is configured to restrict movement of the first guide body relative to the gripping body section in the first direction and the second direction, and allow movement of the first guide body relative to the gripping body section in an up-down direction within a predetermined first range, and the second support mechanism is configured to restrict movement of the second guide body relative to the gripping body section in the first direction and the second direction, and allow movement of the second guide body relative to the gripping body section in the up-down direction within a predetermined second range.

According to this configuration, even if there is error in the amount by which the gripping device is lowered during the lowering operation for gripping, the first guide body can be appropriately brought into contact with the first grip section, and the second guide body can be appropriately brought into contact with the target grip section. Therefore, it is easy to appropriately correct the position and the angle of the gripping body section relative to the container.

It is preferable that the target grip section is the second grip section.

According to this configuration, the first guide body, which is configured to come into contact with the first grip section, and the second guide body, which is configured to come into contact with the target grip section (second grip section), are spaced apart from each other in the second direction. For this reason, it is easy to ensure a large distance between the first guide body and the second guide body. Therefore, according to the above configuration, it is easy to appropriately correct the angle of the gripping body section relative to the container around the vertical axis.

It is preferable that, with a first side in the first direction being one side in the first direction, and a second side in the first direction being another side in the first direction, the first guide body further includes a third guide surface configured to be located on the first side in the first direction of the first grip section after completion of the lowering operation for gripping, the second guide body further includes a fourth guide surface configured to be located on the second side in the first direction of the target grip section after completion of the lowering operation for gripping, and correction of a position in the first direction of the gripping body section relative to the first grip section and the target grip section is performed by at least either the third guide surface coming into contact with the first grip section or the fourth guide surface coming into contact with the target grip section.

According to this configuration, during the lowering operation for gripping, the position in the first direction of the gripping body section relative to the container can also be corrected.

It is preferable that the first grip section and the second grip section each include:

a grip body section spaced upward from the body upper surface and shaped as a narrow plate extending along the first direction; and a connecting section connecting the grip body section and the body upper surface, the pair of first guide surfaces are shaped as flat surfaces inclined so as to approach each other while extending upward, and extend along the first direction during the lowering operation for gripping, and the pair of second guide surfaces are shaped as flat surfaces inclined so as to approach each other while extending upward, and extend along the first direction during the lowering operation for gripping.

According to this configuration, as the lowering operation for gripping continues while either one of the first guide surfaces is in contact with the grip body section, the grip body section moves relative to the pair of first guide surfaces, toward an intermediate position between the pair of first guide surfaces in the second direction. While the grip body section is at the intermediate position between the pair of first guide surfaces in the second direction, the position of the first guide body in the second direction is corrected. The pair of second guide surfaces and the grip body section also move relative to each other in a similar manner. For this reason, while the grip body section is arranged between the pair of second guide surfaces in the second direction, the position of the second guide body in the second direction is corrected. Therefore, according to the above configuration, by executing the lowering operation for gripping, the position in the second direction and the angle around the vertical axis can be appropriately corrected for both the first guide body and the second guide body.

It is preferable that at least either the first grip section or the second grip section includes a positioning recession in an upper surface, the gripping device further includes a positioning body configured to position the gripping device relative to the positioning recession by engaging with the positioning recession, and the first guide body and the second guide body are formed such that a first allowable deviation amount and a second allowable deviation amount are greater than an allowable positioning deviation amount, where the first allowable deviation amount is a maximum amount of deviation in the second direction between the first guide body and the first grip section according to which at least one of the pair of first guide surfaces can come into contact with the first grip section, the second allowable deviation amount is a maximum amount of deviation in the second direction between the second guide body and the target grip section according to which at least one of the pair of second guide surfaces can come into contact with the target grip section, and the allowable positioning deviation amount is a maximum amount of deviation in the second direction between the positioning body and the positioning recession according to which the positioning body can engage with the positioning recession.

According to this configuration, even if the gripping body section deviates from the grip section by an amount according to which the positioning body cannot engage with the positioning recession, the first grip section and the target grip section can be appropriately guided by the first guide body and the second guide body. For this reason, even in the above case, the position of the gripping body section in the second direction and the angle of the gripping body section around the vertical axis can be corrected. Deviation between the positioning body and the positioning recession can thus be kept within a range in which the positioning body can engage with the positioning recession. Therefore, according to the above configuration, the gripping device can be appropriately positioned relative to the container, and the first grip section and the second grip section can be appropriately gripped by the gripping device.

It is preferable that, with a reference range in an up-down direction being a range of relative positions in the up-down direction of the gripping device relative to the container at which the first grip section and the second grip section can be gripped by the pair of grippers, and with a reference range in the second direction being a range of relative positions in the second direction of the gripping device relative to the container at which the first grip section and the second grip section can be gripped by the pair of grippers, the first guide body is configured to start to guide the first grip section while the gripping device is located higher than the reference range in the up-down direction, and guide the gripping body section relative to the first grip section in the second direction in such a manner that the gripping device is arranged in the reference range in the second direction while the gripping device is located in the reference range in the up-down direction, and the second guide body is configured to start to guide the target grip section while the gripping device is located higher than the reference range in the up-down direction, and guide the gripping body section relative to the target grip section in the second direction in such a manner that the gripping device is arranged in the reference range in the second direction while the gripping device is located in the reference range in the up-down direction.

According to this configuration, the first grip section and the target grip section are guided during the lowering operation for gripping, and therefore when the gripping device has been arranged in the reference range in the up-down direction by the lowering operation for gripping, the gripping device can then be arranged in the reference range in the second direction. Therefore, according to the above configuration, the position of the gripping body section in the second direction and the angle of the gripping body section around the vertical axis can be appropriately corrected by merely executing the lowering operation for gripping.

INDUSTRIAL APPLICABILITY

The technology according to the present disclosure is applicable to a transport vehicle that travels along a travel route and transports a container having a predetermined shape.

What is claimed is:

1. A transport vehicle configured to travel along a travel route and transport a container having a predetermined shape, the transport vehicle comprising:

a gripping device configured to grip the container; and an elevation device configured to raise and lower the gripping device, wherein:

the container comprises:

a container body; and a first grip section and a second grip section that protrude upward from a body upper surface, which is an upper surface of the container body, and are configured to be gripped by the gripping device, the first grip section and the second grip section extend along a first direction, which is a specified direction parallel with the body upper surface, and are spaced apart from each other in a second direction, which is a direction parallel with the body upper surface and orthogonal to the first direction, the gripping device comprises:

a gripping body section suspended from the elevation device;

a pair of grippers supported by the gripping body section;

a grip drive section configured to move the pair of grippers toward each other and away from each other in the second direction, the grip drive section including a linear motion mechanism;

a first guide body supported by the gripping body section independent of the pair of grippers, and configured to guide the gripping body section relative to the first grip section; and a second guide body supported by the gripping body section independent of the pair of grippers, and configured to guide the gripping body section relative to a target grip section, which is either the first grip section or the second grip section, the first guide body comprises a pair of first guide surfaces configured to be respectively located on opposite sides of the first grip section in the second direction after completion of a lowering operation for gripping, which is an operation in which the gripping device is lowered by the elevation device in order to grip the first grip section and the second grip section with the pair of grippers, the first guide body is further configured to correct a position in the second direction of the gripping body section relative to the first grip section by at least one of the pair of first guide surfaces coming into contact with the first grip section during the lowering operation for gripping, the second guide body comprises a pair of second guide surfaces configured to be respectively located on opposite sides of the target grip section in the second direction after completion of the lowering operation for gripping, the second guide body is further configured to correct a position in the second direction of the gripping body section relative to the target grip section by at least one of the pair of second guide surfaces coming into contact with the target grip section during the lowering operation for gripping, and the first guide body and the second guide body are spaced apart from each other in at least either the first direction or the second direction, wherein:

the first grip section and the second grip section each comprise:

a grip body section spaced upward from the body upper surface and shaped as a narrow plate extending along the first direction; and a connecting section connecting the grip body section and the body upper surface, the pair of first guide surfaces are shaped as flat surfaces inclined so as to approach each other while extending upward, extend along the first direction during the lowering operation for gripping, and are located to surround a first portion of an outer edge of the grip body section after completion of the lowering operation for gripping, the pair of second guide surfaces are shaped as flat surfaces inclined so as to approach each other while extending upward, extend along the first direction during the lowering operation for gripping, and are located to surround a second portion of the outer edge of the grip body section after completion of the lowering operation for gripping.

2. The transport vehicle according to claim 1, wherein:

the gripping device further comprises:

a first support mechanism supporting the first guide body; and a second support mechanism supporting the second guide body, the first support mechanism is configured to restrict movement of the first guide body relative to the gripping body section in the first direction and the second direction, and allow movement of the first guide body relative to the gripping body section in an up-down direction within a predetermined first range, and the second support mechanism is configured to restrict movement of the second guide body relative to the gripping body section in the first direction and the second direction, and allow movement of the second guide body relative to the gripping body section in the up-down direction within a predetermined second range.

3. The transport vehicle according to claim 1, wherein the target grip section is the second grip section.

4. The transport vehicle according to claim 1, wherein:

a first side in the first direction is one side in the first direction, and a second side in the first direction is another side in the first direction, the first guide body further comprises a third guide surface configured to be located on the first side in the first direction of the first grip section after completion of the lowering operation for gripping, the second guide body further comprises a fourth guide surface configured to be located on the second side in the first direction of the target grip section after completion of the lowering operation for gripping, and correction of a position in the first direction of the gripping body section relative to the first grip section and the target grip section is performed by at least either the third guide surface coming into contact with the first grip section or the fourth guide surface coming into contact with the target grip section.

5. The transport vehicle according to claim 1, wherein:

at least either the first grip section or the second grip section comprises a positioning recession in an upper surface, the gripping device further comprises a positioning body configured to position the gripping device relative to the positioning recession by engaging with the positioning recession, and the first guide body and the second guide body are formed such that a first allowable deviation amount and a second allowable deviation amount are greater than an allowable positioning deviation amount, where the first allowable deviation amount is a maximum amount of deviation in the second direction between the first guide body and the first grip section according to which at least one of the pair of first guide surfaces can come into contact with the first grip section, the second allowable deviation amount is a maximum amount of deviation in the second direction between the second guide body and the target grip section according to which at least one of the pair of second guide surfaces can come into contact with the target grip section, and the allowable positioning deviation amount is a maximum amount of deviation in the second direction between the positioning body and the positioning recession according to which the positioning body can engage with the positioning recession.

6. The transport vehicle according to claim 1, wherein:

a reference range in an up-down direction is a range of relative positions in the up-down direction of the gripping device relative to the container at which the first grip section and the second grip section can be gripped by the pair of grippers, and a reference range in the second direction is a range of relative positions in the second direction of the gripping device relative to the container at which the first grip section and the second grip section can be gripped by the pair of grippers, the first guide body is configured to start to guide the first grip section while the gripping device is located higher than the reference range in the up-down direction, and guide the gripping body section relative to the first grip section in the second direction in such a manner that the gripping device is arranged in the reference range in the second direction while the gripping device is located in the reference range in the up-down direction, and the second guide body is configured to start to guide the target grip section while the gripping device is located higher than the reference range in the up-down direction, and guide the gripping body section relative to the target grip section in the second direction in such a manner that the gripping device is arranged in the reference range in the second direction while the gripping device is located in the reference range in the up-down direction.

* * * * *